United States Patent [19]

Megens et al.

[11] Patent Number: 4,982,376

[45] Date of Patent: Jan. 1, 1991

[54] METHOD OF MOUNTING ELECTRICAL AND/OR ELECTRONIC COMPONENTS ON A SINGLE-SIDED PRINTED BOARD

[75] Inventors: Ludovicus Megens; Petrus Vriens, both of Eindhoven, Netherlands

[73] Assignee: U. S. Philips Corporation, New York, N.Y.

[21] Appl. No.: 507,942

[22] Filed: Apr. 10, 1990

[30] Foreign Application Priority Data

Apr. 20, 1989 [NL] Netherlands .................. 8900986

[51] Int. Cl.⁵ ..................... H05K 7/02; H05K 3/34
[52] U.S. Cl. ..................... 361/400; 29/840; 29/843; 174/263; 228/180.1; 361/417; 361/419
[58] Field of Search ................. 228/180.1, 180.2; 29/839, 840, 843; 174/263; 361/400, 403, 409, 405, 417, 419, 420

[56] References Cited

U.S. PATENT DOCUMENTS

| | | | |
|---|---|---|---|
| 2,915,678 | 12/1959 | Frazier et al. | 174/263 X |
| 3,065,524 | 11/1962 | Donnell et al. | 174/263 X |
| 3,143,787 | 8/1964 | Babbe | 174/263 X |
| 3,159,906 | 12/1964 | Telfer | 29/843 |
| 3,230,612 | 1/1966 | Potter et al. | 29/843 X |
| 3,528,173 | 9/1970 | Gall | 29/839 |
| 3,867,760 | 2/1975 | Horecky et al. | 29/893 X |
| 4,139,881 | 2/1979 | Shimizu et al. | |
| 4,242,719 | 12/1980 | Conley | 174/263 X |
| 4,373,259 | 2/1983 | Motsoh | 29/840 |
| 4,515,304 | 5/1985 | Berger | 228/180.1 X |
| 4,761,881 | 8/1988 | Bora et al. | 29/840 |

FOREIGN PATENT DOCUMENTS

| | | |
|---|---|---|
| 0058766 | 4/1982 | European Pat. Off. |
| 1065898 | 9/1959 | Fed. Rep. of Germany |
| 58-221667 | 12/1983 | Japan .......... 228/180.1 |

OTHER PUBLICATIONS

Technical Notes (RCA) Tn No.: 817, Mailed 1/12/1969, pp. 1–3 by E. Leshner.

Primary Examiner—Carl E. Hall
Assistant Examiner—Carl J. Arbes
Attorney, Agent, or Firm—William Squire

[57] ABSTRACT

Hollow lead connection elements are placed in through holes in a one-side printed circuit board and are reflow soldered to the conductors with SMD devices on the conductor side of the board. Components are positioned on the conductor side with their leads passed through the connection elements. The leads are wave soldered to the elements on the side of the board opposite the conductors. The elements may have spring-loaded tongues for securing the leads thereto prior to soldering and a flange on the conductor side of the board.

9 Claims, 1 Drawing Sheet

METHOD OF MOUNTING ELECTRICAL AND/OR ELECTRONIC COMPONENTS ON A SINGLE-SIDED PRINTED BOARD

The invention relates to a method of mounting electrical and/or electronic components on a single-sided printed board, in which method wire components, whose connection wires are passed through component holes in the printed board, and SMD (surface mounted devices) components, which are placed on the track side of the printed board, are secured to the printed board by soldering.

Of interest is copending application entitled "Method of mounting electrical and/or electronic components on a printed circuit board" filed concurrently herewith by Megens et al and assigned to the assignee of the present invention.

In such a method, which is known from US-A-4,139,881, the connection wires of the wire components are passed from the non-printed side of the printed board through the component holes and clinched, while the SMD components are secured to the printed circuit conductor side of the printed board by means of a glue dot, after which the printed board is passed along a solder wave with its printed conductor side facing the wave so that the wire components and SMD components are soldered to the printed board.

The term "SMD components" (Surface Mounted Devices) is understood to mean components designated and/or suitable for surface mounting. The term "single-sided printed board" is understood to mean a printed board on which the connection surfaces and the printed circuit conductors are found on one and the same side.

Practice has shown that the wave soldering process is highly suitable for soldering of wire components on a printed board and leads to reliable soldered joints. For mounting SMD components, however, the wave soldering process is less suitable because the SMD components are immersed in the solder wave, the solder flows around these components, and air and gas bubbles can remain in the soldered joints. Furthermore, the Manhattan or tombstone effect can occur in mounting of comparatively high components, which means that the solder spots are difficult to reach for the liquid solder as a result of the relatively narrow gaps between adjoining components. The mechanical strength, the reliability and the reproducibility of such soldered joints as a rule fail to meet the quality and reliability requirements set in practice.

In order to solve this problem, the said U.S. Pat. No. 4,139,881 proposes the application of vent holes in the printed board at the area of the soldered joints between the SMD components and the printed board, so that air and gases can escape during soldering and the generation of bubbles is prevented. The application of separate vent holes in the printed board has in practice been shown to be not feasible in view of the ever increasing miniaturization and the increasing printed conductor and packing densities of printed boards.

It has been shown that, in wave soldering of SMD components on printed boards, a good wetting of the components by the solder is obtained with a reduced risk of the generation of air and gas bubbles if a double or multiple solder wave is used. A soldering device with two or more solder waves is known from, for example, EP-B-0 058 766. The wave soldering of SMD components imposes restrictions. The following conditions must be complied with in order to prevent bridging and short-circuiting when a single or double solder wave is used:

1. $a \geq 1$ mm, a being the centre-to-centre distance between adjoining connection surfaces of the SMD components (FIG. 2);
2. $b \geq 0.5$ mm, b being the distance between adjoining solder surfaces on the printed board (FIG. 2).

The first condition excludes an important group of components, i.e. integrated circuits in VSO (Very Small Outline) envelopes, QFP (Quad Flat Pack) envelopes, or in PLCC (Plastic Leaded Chip Carrier) envelopes. The second condition forms an impediment to achieving the greatest possible packing density.

The packing density of SMD components on a printed board can be increased through the use of the reflow soldering method, which makes it possible to reduce the minimum admissible distance b between adjoining solder surfaces to 0.1–0.2 mm. Moreover, the use of the reflow soldering method makes it possible to reduce the minimum admissible centre-to-centre distance a between adjoining connection surfaces of the SMD components to 0.3 mm, so that substantially all commercially available SMD components are suitable for use in this soldering method. Reflow soldering is the most suitable method for soldering SMD components. In reflow soldering, solder is first applied on the soldering surfaces of the printed board, for instance in the form of a soldering paste, after which the components are put on the soldering paste via their connection surfaces, and finally the required heat is supplied to melt the solder and establish the connection of the components with the printed board. The known heat supply systems operate on the basis of heat conduction, UV radiation, IR radiation, or liquid condensation (vapour phase). Fixing of the components by means of glue is omitted here. In the case of wave soldering, the components are first positioned on the printed board and provisionally fixed, after which the liquid solder and the heat required for soldering are supplied simultaneously by means of a wave soldering bath.

The invention has for its object to provide a method of mounting components which offers the possibility to mount both groups of components on a single-sided printed board, while the advantages of the specific soldering method for each group are maintained.

According to the invention, this object is mainly achieved in that the wire components are positioned on the printed conductor side of the printed board and are mounted on the printed board by means of connection elements, the SMD components and their connection elements being mounted on the printed board by reflow soldering, and the connection wires of the wire components being connected to the connection elements by wave soldering. If, according to the invention, the wire components are applied on the printed conductor side of the printed board, and due to the application of connection elements, the soldered joints of the connecting wires will lie on the non-printed side of the printed board and are thus separated from the soldered joints of the SMD components at the printed conductor side of the printed board. The connection elements are regarded as SMD elements. The problems referred to above are avoided and optimal results are obtained for these connections due to the reflow soldering method being used for soldering the SMD components. For soldering the connection wires, wave soldering is used, which is the most suitable method for this purpose.

It is noted in this connection that the German Auslegeschrift DE-A-10 65 898 discloses the use of soldering bushes e.g., eyelets, but not in combination with SMD components. These soldering bushes perform the function of a through-metallized hole and are connected mechanically to the printed board by flanging or riveting. In contrast to this, the connection elements according to the invention are applied on the printed board in freely suspended state exclusively by means of a soldered joint. The problems arising during soldering of both wire components and SMD components on a single-sided printed board do not occur when these known soldering bushes are used.

A preferred embodiment of the method according to the invention is characterized in that solder is applied on soldering surfaces for SMD components and on soldering surfaces around the component holes, in that the SMD components are put on the printed board and the connection elements are passed through the component holes from the track side, after which the SMD components and the connection elements are secured to the printed board by reflow soldering, in that subsequently the connection wires of the wire components are inserted in the connection elements from the track side, and in that finally the connection wires are connected to the connection elements by wave soldering.

In this embodiment, the soldering of the SMD components on the one hand and of the wire components on the other hand takes place in two separate steps. The solder, tin or a lead-tin alloy, can be applied in the form of a soldering paste, by electroplating or by hot tinning. The reflow soldering of the SMD components and of the connection elements can be optimally achieved through the application of the most suitable heating method, such as heat radiation, either UV radiation or IR radiation, heat conduction, liquid condensation (vapour phase), and other means. A single solder wave is sufficient for wave soldering of the wire components.

A further preferred embodiment of the method according to the invention is characterized in that solder is applied on soldering surfaces for SMD components and on soldering surfaces around the component holes, in that the SMD components are put on the printed board and the connection elements are inserted in the component holes from the printed conductor side, after which the connection wires of the wire components are inserted in the connection elements from the track side, and in that finally the SMD components are secured to the printed board by means of a wave soldering bath and the connection elements by means of reflow soldering, while simultaneously the connection wires of the wire components are secured to the connection elements.

In this embodiment the reflow soldering of the SMD components takes place simultaneously with the wave soldering of the wire components, the heat required for the reflow soldering being supplied by the liquid tin of the wave soldering bath. Certain conditions must be fulfilled for the application of this embodiment: the components must be resistant to the comparatively high temperatures for a longer period than in other processes; the material of the printed board must also be resistant to these temperatures; preheating of the printed board with components including preheating of the upper side of the printed board is necessary.

A single-sided printed board comprising electrical and/or electronic SMD and wire components mounted on the printed board by the method according to the invention is clearly characterized in that both the SMD components and the wire components are applied on the printed conductor side of the printed board, in that the printed board is provided with soldering surfaces on the conductor side around the component holes and in that the wire components are secured to the printed board through the interposition of connection elements. The soldered joints of the SMD components on the conductor side of the printed board obtained through reflow soldering on the one hand and the soldered joints between the connection wires of the wire components and the connection elements on the other hand each have a characteristic appearance and are clearly recognizable. The connection elements are mounted on the printed board is freely suspended state exclusively by means of a soldered joint.

The invention also relates to a connection element designed to be used in the method according to the invention. All possible embodiments must fulfil two requirements: the external diameter must be adapted to the diameter of the component holes and the internal diameter must be adapted to the diameter of the connection wires of the wire components. All embodiments are characterized by a radial surrounding flange near one end.

The invention will now be explained in more detail with reference to the drawing, in which.

Figure 1:
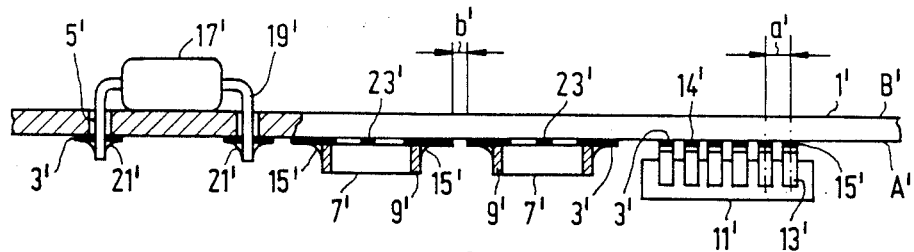
FIG. 1 shows a single-sided printed board comprising components soldered by the known method.

FIG. 1 shows in part a cross-section of a single-sided printed board 1' having at one side a printed conductor pattern with soldering surfaces 3' and with component holes 5'. A' designates the printed conductor side and B' the non-printed side of the printed board 1'. SMD components 7' with connection surfaces (metallisations) 9' and an SMD component 11' with connection legs 13', each with a connection surface 14', are mounted on the conductor side A' by means of soldered joints 15'. On the other, non-printed side B' of the printed board 1' is mounted a wire component 17', whose connection wires 19' are passed through the component holes 5' and are connected with the soldering surfaces 3' on the printed board 1' by means of soldered joints 21'. The soldered joints between the SMD components 7' and 11' and the printed board 1' have been designated with the reference numeral 15'. b' denotes the smallest admissible distance between two adjoining soldering conductors 3', while a' denotes the smallest centre-to-centre distance between two adjoining connection legs 13'. The printed board 1' shown in FIG. 1 is obtained by the known method, as described above, by means of a wave soldering process in which the SMD components 7' and 11' are secured on the printed board 1' with glue dots 23' and are fully immersed in the solder during soldering, while conductors side A' of the printed board faces downwards. The soldered joints 15' and 21' are obtained in the same soldering step. The drawbacks of this soldering method have been explained above.

Figure 2:
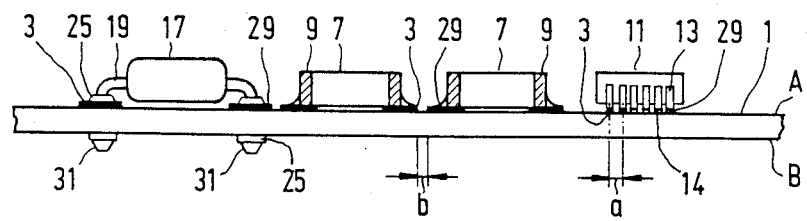
FIG. 2 shows a single-sided printed board comprising components soldered by the method according to the invention.
Figure 3:
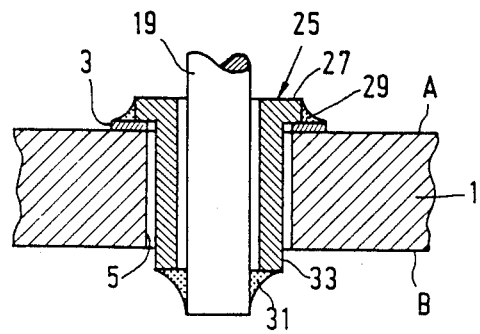
FIGS. 3, 4 and 5 show various embodiments of connection elements used for the method according to the invention.
Figure 4:
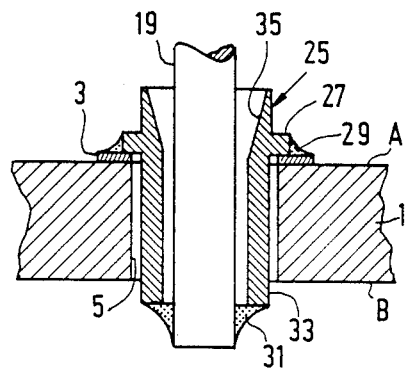
Figure 5:
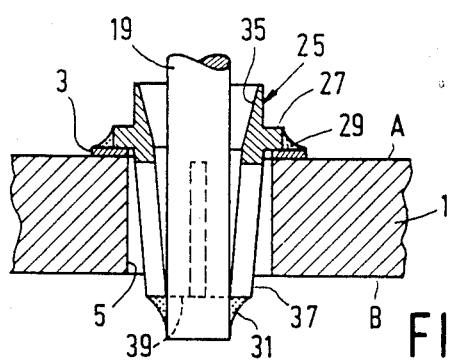

FIG. 2 shows a single-sided printed board 1 with SMD components 7 and 11 which are applied on the conductors side A of the printed board. A wire component 17 is also applied on the track side A of the printed board. Connection wires 19 of component 17 are inserted in connection elements 25, which were inserted in the component holes of the printed board from the conductor side A. As FIGS. 3, 4 and 5 show on an enlarge scale, the connection elements 25 rest with a flange or shoulder 27 on a soldering conductor 3, which surrounds the associated component hole 5. According to the invention, the soldering surfaces 3 are provided with solder, after which the SMD components 7 and 11 and the connection elements 25 are applied.

In an embodiment of the method according to the invention, a reflow soldering step is now carried out first and the soldered joints 29 then formed. Then the connection wires 19 of the wire component 17 are inserted in the soldering bushes 25, after which a wave soldering step is carried out with the conductors side A of the printed board facing upwards, so that soldered joints 31 are obtained.

In an alternative embodiment the separate reflow soldering step is omitted and, after the SMD components have been positioned and the wire component 17 has been mounted, all soldered joints, both the joints 29 and the joints 31, are realised simultaneously by means of a single soldering step in a solder wave. The soldered joints obtained through reflow soldering are indicated with 29, the soldered joints obtained through wave soldering with 31.

A comparison of FIGS. 1 and 2 shows that the minimum admissible distance a between adjoining soldering surfaces 3 is smaller than distance a' that the minimum admissible centre-to-centre distance b between adjoining connection legs 13 is smaller than distance b' and that SMD component 11 in its entirety is smaller than SMD component 11'.

FIGS. 3, 4 and 5 show various embodiments of the connection element 25. FIG. 3 shows the simplest embodiment, which consists of a cylindrical sleeve 33 with the surrounding radial flange or shoulder 27.

The embodiment according to FIG. 4 also comprises a cylindrical sleeve 33 with flange 27, to which is added a tapering entrance 35 for facilitating the insertion of the connection wires 19.

The embodiment shown in FIG. 5 comprises a tapering sleeve 37 with spring-loaded tongues 39, with which it is achieved that the connection wire 19 is mechanically held.

We claim:

1. A single-sided printed circuit board construction in which the board has printed conductors on one side thereof and through holes for component leads, said construction comprising:
  at least one SMD component soldered to a corresponding at least one said conductors on said one side;
  a hollow component lead connection element in one of said holes;
  an electrical component positioned on said one side, said component having a wire lead passing through said element; and
  solder means connecting the lead to said element on a side of the board opposite the one side.

2. The construction of claim 1 wherein said element is soldered to a conductor on said one side.

3. The construction claim 1 wherein said element includes a cylindrical sleeve having a flange at one end thereof and a spring-loaded tongue at the other end for securing the passed through lead to the element.

4. A method of mounting electrical and/or electronic components on a printed conductor board whose printed conductors are on one side thereof, said board being of the type having holes through which component connection wires are passed and SMD components mounted on the printed conductor side of the board secured by solder to the printed conductors, said method comprising:
  positioning hollow connection elements in said holes;
  reflow soldering the connection elements and SMD components to the printed conductors;
  positioning components with wire leads on the conductor side of the board;
  passing the leads through said hollow connection elements; and
  soldering the leads to said connection elements on the side of the board opposite said one side.

5. A method as claimed in claim 4 including applying solder on printed conductor soldering surfaces of SMD components and on printed conductor soldering surfaces around the component holes,
  placing the SMD components on the printed board and passing the connection elements through the component holes from the conductor side,
  after which securing the SMD components and the connection elements to the printed board by reflow soldering,
  subsequently inserting the connection wires of the wire components in the connection elements from the conductor side, and
  finally connecting the connection wires to the connection elements by wave soldering.

6. A method as claimed in claim 4 applying
  solder on printed conductor soldering surfaces for SMD components and on printed conductor soldering surfaces around the component connection wire holes,
  placing the SMD components on the printed board and inserting the connection elements in the component holes from the conductor side,
  after which inserting the connection wires of the wire components in the connection elements from the conductor side,
  and finally securing the SMD components to the printed board by means of a wave soldering bath, and reflow soldering the connection elements to the conductors of the printed board, while simultaneously securing the connection wires of the wire components to the connection elements.

7. A method of mounting electrical and/or electronic components on a printed conductor board whose printed conductors are on one side thereof, said board being of the type having holes through which component leads are passed and SMD components mounted on the printed conductor side of the board secured by solder to the printed conductors, said method comprising:
  positioning hollow connection elements in said holes;
  positioning wire lead components on the conductor side of the board;
  passing the leads through said hollow connection elements; and
  soldering the SMD components and elements to the conductors on the one side of the board and the leads to said connection elements on the side of the board opposite said one side.

8. The method of claim 7 wherein said soldering step includes reflow soldering the SMD components and elements to said conductors on the one side and wave soldering the leads on said opposite side.

9. The method of claim 7 wherein said soldering step includes wave soldering said SMD components and elements to said conductors and said leads to said elements.

* * * * *